United States Patent
Edsinger

(10) Patent No.: US 10,275,543 B1
(45) Date of Patent: Apr. 30, 2019

(54) END-OF-ARM FINGERTIP PIPELINE

(71) Applicant: X Development LLC, Mountain View, CA (US)

(72) Inventor: Aaron Edsinger, San Francisco, CA (US)

(73) Assignee: X Development LLC, Mountain View, CA (US)

(*) Notice: Subject to any disclaimer, the term of this patent is extended or adjusted under 35 U.S.C. 154(b) by 700 days.

(21) Appl. No.: 14/558,913

(22) Filed: Dec. 3, 2014

(51) Int. Cl.
*G06F 17/50* (2006.01)
*H04L 29/08* (2006.01)
*G05B 19/4099* (2006.01)

(52) U.S. Cl.
CPC ......... *G06F 17/50* (2013.01); *G05B 19/4099* (2013.01); *H04L 67/10* (2013.01)

(58) Field of Classification Search
CPC ...... G06F 17/50; G05B 19/4099; H04L 67/10
See application file for complete search history.

(56) References Cited

U.S. PATENT DOCUMENTS

| | | | |
|---|---|---|---|
| 4,613,277 A | 9/1986 | Guay | |
| 5,108,140 A | 4/1992 | Bartholet | |
| 6,901,437 B1* | 5/2005 | Li | H04L 67/2823 707/999.01 |
| 8,240,729 B2 | 8/2012 | Vittor | |
| 8,833,827 B2* | 9/2014 | Ciocarlie | B25J 15/08 294/106 |
| 2013/0245823 A1 | 9/2013 | Kimura et al. | |
| 2014/0012415 A1 | 1/2014 | Benaim et al. | |
| 2014/0191522 A1 | 7/2014 | Birglen | |

FOREIGN PATENT DOCUMENTS

WO    WO 2012146943 A2 * 11/2012

OTHER PUBLICATIONS

Goldfeder, C. and Allen, P. K. "Data-driven grasping" in: Autonomous Robots, vol. 31, Issue 1, pp. 1-20, Jul. 2011 [retrieved on Apr. 10, 2017]. Retrieved from the Internet <https://personalrobotics.ri.cmu.edu/files/courses/papers/GoldfederAllen11-datadriven.pdf><DOI 10.1007/s10514-011-9228-1>.*

(Continued)

*Primary Examiner* — Suzanne Lo
(74) *Attorney, Agent, or Firm* — McDonnell Boehnen Hulbert & Berghoff LLP

(57) ABSTRACT

Example implementations described herein may provide a pipeline from a model of a given object to a model of one or more fingertips that are specialized to grasp the given object. An example system may receive a three-dimensional geometric model of a given object. The system may also iterate over a plurality of fingertip geometries to determine a particular fingertip geometry that is compliant to a shape of the given object at a grasp point on the given object. The system may further iterate the particular fingertip geometry over a plurality of fingertip sizes to determine a particular fingertip size that is compliant to one or more dimensions of the given object at the grasp point of the given object; and the system may provide a model of one or more fingertips having the particular fingertip geometry and the particular fingertip size.

11 Claims, 16 Drawing Sheets

(56) References Cited

OTHER PUBLICATIONS

Granta, CES 2014 Selector: User Manual & Getting Started Guide [online], 2013 [retrieved Apr. 13, 2017] Retrieved from the Internet <URL: https://grantadesignsupport.worldsecuresystems.com/_literature_120209/CES_Selector_2014_User_Manual_and_Getting_Started_Guide>.*

Granta, CES 2010 EduPack Resource Booklet 2: Material and Process Selection Charts [online], Jan. 2010 [retrieved Apr. 13, 2017] Retrieved form the Internet <URL: http://www.grantadesign.com/download/pdf/teaching_resource_books/2-Materials-Charts-2010.pdf>.*

Pena-Pitarch, E. et al., "Virtual Human Hand: Grasping and Simulation" in Duffy V.G. (eds) Digital Human Modeling. ICDHM 2009. Lecture Notes in Computer Science, vol. 5620. [retrieved on Apr. 13, 2017] Retrieved online from SpringerLink <URL: https://link.springer.com/content/pdf/10.1007%2F978-3-642-02809-0_16.pdf><DOI: 10.1007/978-3-642-02809-0_16>.*

Hang, K. et al., "Friction Coefficients and Grasp Synthesis" in 2013 IEEE/RSJ International Conference on Intelligent Robots and Systems, Tokyo, 2013, pp. 3520-3526. [retrieved on Apr. 17, 2017] Retrieved online from IEEE Xplore <URL: http://ieeexplore.ieee.org/stamp/stamp.jsp?tp=&arnumber=6696858&isnumber=6696319><doi: 10.1109/IROS.2013.6696858>.*

Velasco Jr., V. B. et al., "Computer-Assisted Gripper and Fixture Customization Using Rapid-Prototyping Technology" in: Proceedings of the 1998 IEEE International Conference on Robotics & Automation, Leuven, Belgum, May 1998, [retrieved on Apr. 7, 2017]. Retrieved online from IEEE Xplore <URL:http://ieeexplore.ieee.org/stamp/stamp.jsp?arnumber=68139>.*

Pham, D. T. et al., "Automated configuration of gripper systems for assembly tasks" in Proceedings of the Institution of Mechanical Engineers Part B Journal of Engineering Manufacture 221(11): 1643-1649, Nov. 2007 [retrieved on Apr. 7, 2017] Retrieved online from ResearchGate <URL: https://www.researchgate.net/publication/245386825>.*

Pedrazzoli et al. "A Rule Based Approach to the Gripper Selection Issue for the Assembly Process", 2001, Proc. of the $4^{th}$ IEEE International Symposium on Assembly and Task Planning, pp. 202-207.*

Sanfilippo et al. "Efficient Modular Grasping: an Iterative Approach", 2012, The $4^{th}$ IEEE/RAS/EMBS International Conference on Biomedical Robotics and Biomechatronics, pp. 1281-1286.*

Leon et al. "OpenGRASP: A New Robot Grasping Simulation Toolkit", 2010, 6 pages.*

GraspIT! User Manual, Version 2.2.

* cited by examiner

END-OF-ARM FINGERTIP PIPELINE

BACKGROUND

Unless otherwise indicated herein, the materials described in this section are not prior art to the claims in this application and are not admitted to be prior art by inclusion in this section.

Example robotic devices may include robotic manipulators, such as robotic arms, to interact with an environment in which the robotic devices are operating. Some robotic manipulators include a device known as an end-effector to manipulate objects within the environment. The nature of the end-effector may depend on the application or applications of the robotic device. End-effectors may be referred to generally as end-of-arm tooling. Various types of end-effectors exist, such as grippers or tools. Some grippers are considered impactive in that they use jaws or claws to physically grasp by direct impact upon an object. Other types of grippers may use other types other types of prehension, such as suction or adhesion.

In some cases, end-of-arm tooling for a robotic arm or other robotic manipulator may be specialized to a particular application. For instance, the end-of-arm tooling may be specialized to a particular object that an end-effector will be tasked to manipulate. Such specialization may improve the repeatability of robotic operations. As noted above, some grippers may use jaws or claws to physically grasp an object. In some cases, such jaws or claws may be modeled after a human hand to include one or more robotic fingers that can manipulate the environment. The robotic fingers may include fingertips that are specialized to grasp a certain object or type of object.

BRIEF SUMMARY

Within examples, a computing system may provide a pipeline that facilitates the design and production of specialized robotic fingertips. As noted above, robotic fingertips may be specialized to particular applications, such as the manipulation of a particular object or type of objects. The pipeline may facilitate design and production of specialized robotic fingertips for grasping a variety of objects by providing one or more specialized robotic fingertips based on a model of an object.

In an example implementation, a computing system may receive a three-dimensional geometric model of a given object. The computing system may also iterate over a plurality of fingertip geometries to determine a particular fingertip geometry that is compliant to a shape of the given object at a grasp point on the given object. The computing system may further iterate the particular fingertip geometry over a plurality of fingertip sizes to determine a particular fingertip size that is compliant to one or more dimensions of the given object at the grasp point of the given object. The computing system may also determine a particular fingertip material that satisfies a threshold coefficient of friction associated with grasping a material of the given object at the grasp point. The computing system may provide a model of one or more fingertips having the particular fingertip geometry, the particular fingertip size, and the particular fingertip material.

Another example implementation may involve receiving a three-dimensional geometric model of a given object. The implementation may further involve iterating over a plurality of fingertip geometries to determine a particular fingertip geometry that is compliant to a shape of the given object at a grasp point on the given object. The implementation may also involve iterating the particular fingertip geometry over a plurality of fingertip sizes to determine a particular fingertip size that is compliant to one or more dimensions of the given object at the grasp point of the given object. The implementation may involve determining a particular fingertip material that satisfies a threshold coefficient of friction associated with grasping a material of the given object at the grasp point and providing a model of one or more fingertips having the particular fingertip geometry, the particular fingertip size, and the particular fingertip material.

Another example implementation may include a computing system that includes one or more processors and data storage configured to store instructions, that when executed by the one or more processors, cause the computing system to perform operations. The operations may include receiving a three-dimensional geometric model of a given object. Upon detecting that a tool database includes a model of one or more fingertips for the given object, the operations may also include providing the model of the one or more one or more fingertips for the given object from the tool database. Upon detecting that the tool database excludes the model of the one or more fingertips for grasping the given object, the operations may involve determining a model of one or more fingertips for the given object. Determining the model of one or more fingertips may involve iterating over a plurality of fingertip geometries to determine one or more particular fingertip geometries that are compliant to a shape of the given object at a grasp region on the given object, iterating the one or more particular fingertip geometries over a plurality of fingertip sizes to determine one or more particular fingertip sizes that are compliant to one or more dimensions of the given object at the grasp region of the given object, and providing the determined model of the one or more fingertips having the one or more particular fingertip geometries and the one or more particular fingertip sizes.

Yet another example implementation includes a system may that include a means-for receiving a three-dimensional geometric model of a given object. The system may also include a means-for iterating over a plurality of fingertip geometries to determine a particular fingertip geometry that is compliant to a shape of the given object at a grasp point on the given object. The system may also include a means-for iterating the particular fingertip geometry over a plurality of fingertip sizes to determine a particular fingertip size that is compliant to one or more dimensions of the given object at the grasp point of the given object. The system may also include a means-for a particular fingertip material that satisfies a threshold coefficient of friction associated with grasping a material of the given object at the grasp point. The system may also include a means-for providing a model of one or more fingertips having the particular fingertip geometry, the particular fingertip size, and the particular fingertip material.

These as well as other aspects, advantages, and alternatives, will become apparent to those of ordinary skill in the art by reading the following detailed description, with reference where appropriate to the accompanying figures.

DETAILED DESCRIPTION

Figure 1:
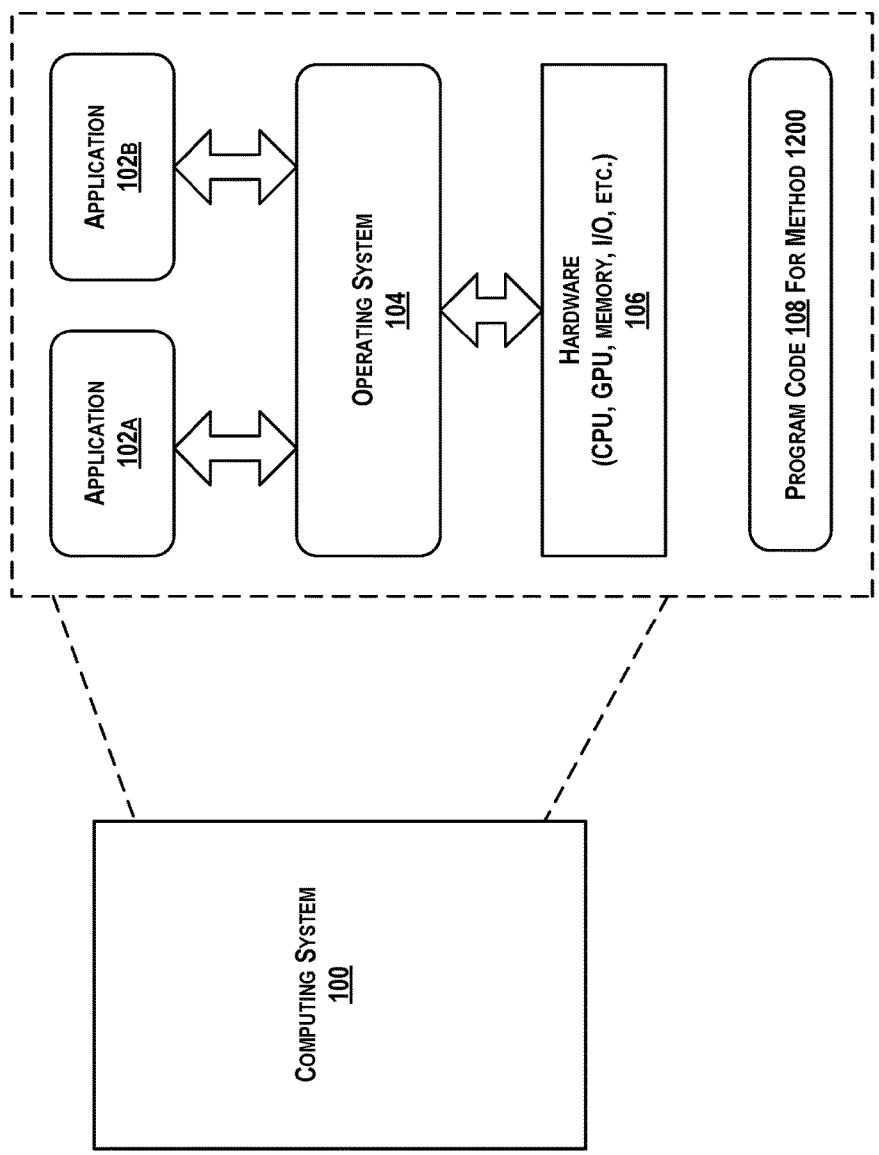
FIG. 1 illustrates an example computing system by which an example method may be implemented.

Example methods and systems are described herein. Any example implementation or feature described herein is not necessarily to be construed as preferred or advantageous over other implementations or features. The example implementations described herein are not meant to be limiting. Certain aspects of the disclosed systems and methods can be arranged and combined in a wide variety of different configurations, all of which are contemplated herein.

Furthermore, the particular arrangements shown in the figures should not be viewed as limiting. Other implementations might include more or less of each element shown in a given figure. Further, some of the illustrated elements may be combined or omitted. Yet further, an example implementation may include elements that are not illustrated in the figures.

End-of-arm tooling of a robotic manipulator may include a gripper for gripping various objects, such as consumer goods. Some grippers may be modeled after a human hand, such that the gripper includes one or more fingers. The fingers may include respective fingertips, which may be referred to collectively as a fingertip set.

While some fingertips may be designed to pick up objects generally, other fingertip sets may include one or more fingertips that are specialized to grasp a particular object. More particularly, some fingertips may be specialized to grasp a particular object in a particular manner to accomplish a particular task. For example, one or more fingertips may be specialized to pick up a particular type of soda bottle at a particular grasp point on that type of soda bottle (e.g., on the neck of the soda bottle). In operation, a robotic manipulator may use a gripper having that fingertip set to pick up the particular soda bottles according to a particular approach path (e.g., from above a soda bottle down to its neck). In some cases, specialized fingertip sets may provide a relatively stronger or more secure grip than a general-use gripper.

To specialize one or more fingertips for grasping a given object, the one or more fingertips may have a particular shape, size, and/or material that is compliant to the given object. For instance, the fingertip set noted above that is specialized to pick up the soda bottle may have curved interior surface. Such a curved interior surface may provide a greater surface contact area around a round neck of the soda bottle. Further, the curved interior surface may be sized to fit around the round neck of the soda bottle, which may further increase the surface contact area for relatively improved gripping. In addition, the fingertips may be made of one or more materials that reduce friction between the fingertips and the soda bottle, such as rubber.

Within examples, a computing system may receive, as an input, a three-dimensional (3-D) model of a given object and, provide, as an output, a model of one or more fingertips that are specialized to grasp the given object. A manufacturing system (e.g., a 3-D printer) may produce an instance of the one or more fingertips based on the model of the one or more fingertips. Such a computing system may facilitate producing specialized grippers for particular objects.

The computing system may include an input module that receives a three-dimensional geometric model of a given object. In some implementations, the input module may retrieve the three-dimensional geometric model of the given object from a database that includes a plurality of 3-D models. For instance, the computing system may be communicatively coupled to a database containing three-dimensional geometric models of consumable objects, perhaps by way of a network interface. Alternatively, the input module could receive the three-dimensional geometric model of the given object from a second computing system, perhaps in a client-server arrangement in which the second computing system is connected over a network (e.g., the Internet) to the first computing system as a client of the first computing system.

In some cases, the computing system may facilitate producing the model of the one of more fingertips for grasping the given object. The computing system may iterate over a plurality of fingertip geometries to determine a particular fingertip geometry that is compliant to (i.e., approximately matches) a shape of the given object at a grasp point on the given object. Such iteration may involve simulating respective grasps of the given object with the different fingertip geometries at the grasp point. Each simulation may produce a respective metric that indicates the quality of the grasp, which may be used to determine the particular fingertip geometry.

After determining the particular fingertip geometry that is compliant to the shape of the given object, the computing system may alter various properties of the fingertip geometry, which may improve the grasp of the given object by the fingertip geometry. For instance, the computing system may iterate over a plurality of fingertip sizes (i.e., growing or shrinking the fingertip geometry) to determine a particular fingertip size compliant to one or more dimensions of the given object at the grasp point of the given object. During each iteration, the computing system may simulate the grasp to evaluate the quality of the grasp with the respective fingertip size. The computing system may also iterate over a plurality of materials having respective coefficients of friction (e.g., plastic, rubber, metal) to determine a particular material that satisfies a threshold coefficient of friction associated with grasping a material of the given object at the grasp point. In combination, these iterations may produce a model of one or more fingertips having the particular geometry, fingertip size, and fingertip material.

In other instances, a model of the one or more fingertips for the given object may have been pre-computed. For example, the computing system may have previously facilitated producing a model of the one or more fingertips for grasping the given object. Alternatively, the computing system may have access to a repository (e.g., a tool database) of models of various fingertip sets for respective objects. In such cases, the computing system may retrieve the model of the end-of-arm tool for the given object from the repository.

After obtaining the model of the one or more fingertips, the computing system may then provide (e.g., transmit) the model to another computing system. The other computing system may facilitate producing one or more physical instances of the one or more fingertips. For example, the computing system may cause a 3-D printer to produce the one or more fingertips.

It should be understood that arrangements described herein are for purposes of example only. As such, those skilled in the art will appreciate that other arrangements and other elements (e.g., machines, interfaces, functions, orders, and groupings of functions, etc.) can be used instead, and some elements may be omitted altogether according to the desired results. Further, many of the elements that are described are functional entities that may be implemented as discrete or distributed components or in conjunction with other components, in any suitable combination and location, or other structural elements described as independent structures may be combined.

Referring now to the figures, FIG. 1 illustrates an example computing system 100 by which example methods may be implemented. Computing system 100 may include applications 102A and 102B and an operating system 104 being executed by hardware 106. The example computing system 100 may be implemented as a PC, a laptop, a smartphones, a tablet computer, a server, a server cluster, or any other suitable computing system. As noted above, operations disclosed herein may be divided among more than one computing device or system.

Each of the applications 102A and 102B may include instructions that when executed cause the computing device 100 to perform specific tasks or functions. Applications 102A and 102B may be native applications (i.e., installed by a manufacturer of the computing device 100 and/or a manufacturer of the operating system 104) or may be a third-party application installed after the computing device 100 is purchased.

The operating system 104 may interact with and manage hardware 106 to provide services for the applications 102A and 102B.

The hardware 106 may include, for example, a central processing unit (CPU), a graphics processor (GPU), memory, an input/output (I/O) interface, user input device (s), and output device(s). Components of hardware 106 may be controlled by instructions contained in applications 102A and 102B and operating system 104.

The central processing unit (CPU) may be operable to effectuate the operation of the computing device 100 by executing instructions stored in memory or disk storage. Such instructions may include the operating system 104 and the applications 102A and 102B. The CPU may, for example, comprise a single or multi-core processor, an application specific integrated circuit (ASIC), field programmable gate array (FPGA), and/or any other suitable circuitry.

The memory may include program memory and run-time memory. The memory may, for example, comprise non-volatile memory, volatile memory, read only memory (ROM), random access memory (RAM), flash memory, magnetic storage, and/or any other suitable memory. Program memory may store instructions executable by the CPU to effectuate operation of the operating system 104 and the applications 102A and 102B. Runtime memory may store data generated or used during execution of the operating system 104 or applications 102A and 102B.

The input/output (I/O) interface may be operable to receive signals from the input device(s), and provide corresponding signals to the CPU and/or the graphics processor.

The input device(s) may include, for example, a mouse, a touchpad, a motion sensor, a trackball, a voice recognition device, a keyboard, or any other suitable input device which enables a user to interact with the computing device 100.

The output devices may include, for example, a screen and speakers. The screen may be, for example, a liquid crystal display (LCD) screen, an OLED screen, an e-ink screen, and/or any other suitable device for presenting a graphical user interface.

Figure 2:
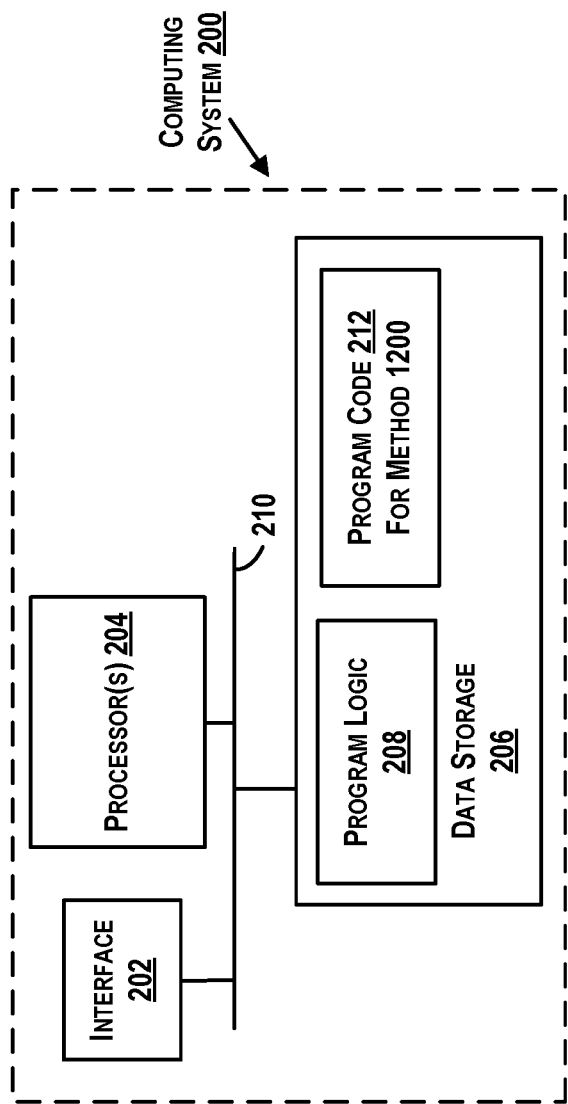
FIG. 2 illustrates example components of an example computing system.

FIG. 2 illustrates example components of an example computing system, such as the example computing system 100 in FIG. 1, among other examples. In some examples, some components illustrated in FIG. 2 may be distributed across multiple computing systems. However, for the sake of example, the components are shown and described as part of one example computing system 200. The computing system 200 may be or include a mobile device, desktop computer, laptop computer, server, server cluster, email/messaging device, tablet computer, or similar device or system that may be configured to perform the operations described herein.

In some implementations, the computing system 200 may include a device platform (not shown), which may be configured as a multi-layered Linux platform, or, alternatively, any suitable platform. The device platform may include different applications and an application framework, as well as various kernels, libraries, and runtime entities. In other examples, other formats or systems may operate the computing system 200 as well.

The computing system 200 may include an interface 202, one or more processors 204, and data storage 206. Components illustrated in FIG. 2 may be linked together by a communication link 210. The computing system 200 may also include hardware to enable communication within the computing system 200 and between the computing system 200 and another computing system (not shown), such as a client entity. The hardware may include transmitters, receivers, and antennas, for example.

The interface 202 may be configured to allow the computing system 200 to communicate with another computing system (not shown), such as a server, laptop, tablet computer, or smartphone. Thus, the interface 202 may be configured to receive input data from one or more computing devices, and may also be configured to send output data to the one or more computing devices.

The interface 202 may include a wired communication component that is configured to facilitate wired data communication for the computing system 200 according to one or more wired communication standards. For example, the wired communication component may include an Ethernet communication component that is configured to facilitate wireless data communication according to one or more IEEE 802.3 standards. Other examples are also possible, such as a fiber-optic communication component.

The interface 202 may include a wireless communication interface that is configured to facilitate wireless data communication for the computing system 200 according to one or more wireless communication standards. For example, the wireless communication component may include a Wi-Fi communication component that is configured to facilitate wireless data communication according to one or more IEEE 802.11 standards. As another example, the wireless communication component may include a Bluetooth communication component that is configured to facilitate wireless data communication according to one or more Bluetooth standards. Other examples are also possible.

In other examples, the interface 202 may also include a user-interface, such as a keyboard, microphone, touchscreen, etc., to receive inputs as well.

The data storage 206 may store program logic 208 (instructions) that can be accessed and executed by the one or more processors 204. The data storage 206 may also store data that may include data received by the interface 202.

The one or more processors 204 may be a general purpose processor that may access program logic 208 that can be retrieved and executed by the one or more processors 204.

The communication link 210 is illustrated as a wired connection; however, wireless connections may also be used. For example, the communication link 210 may be a point-to-point interconnect or system bus, a wired serial bus such as a universal serial bus or a parallel bus, or a wireless connection using, e.g., short-range wireless radio technology, communication protocols described in IEEE 802.11 (including any IEEE 802.11 revisions), among other possibilities.

Example methods described herein may be performed individually by components of the computing system 200, or in combination by one or all of the components of the computing system 200. In one instance, portions of the computing system 200 may process data and provide an output internally in the computing system 200 to the one or more processors 204, for example. In other instances, portions of the computing system 200 may process data and provide outputs externally to other computing devices, perhaps by way of the interface 202.

Figure 3:
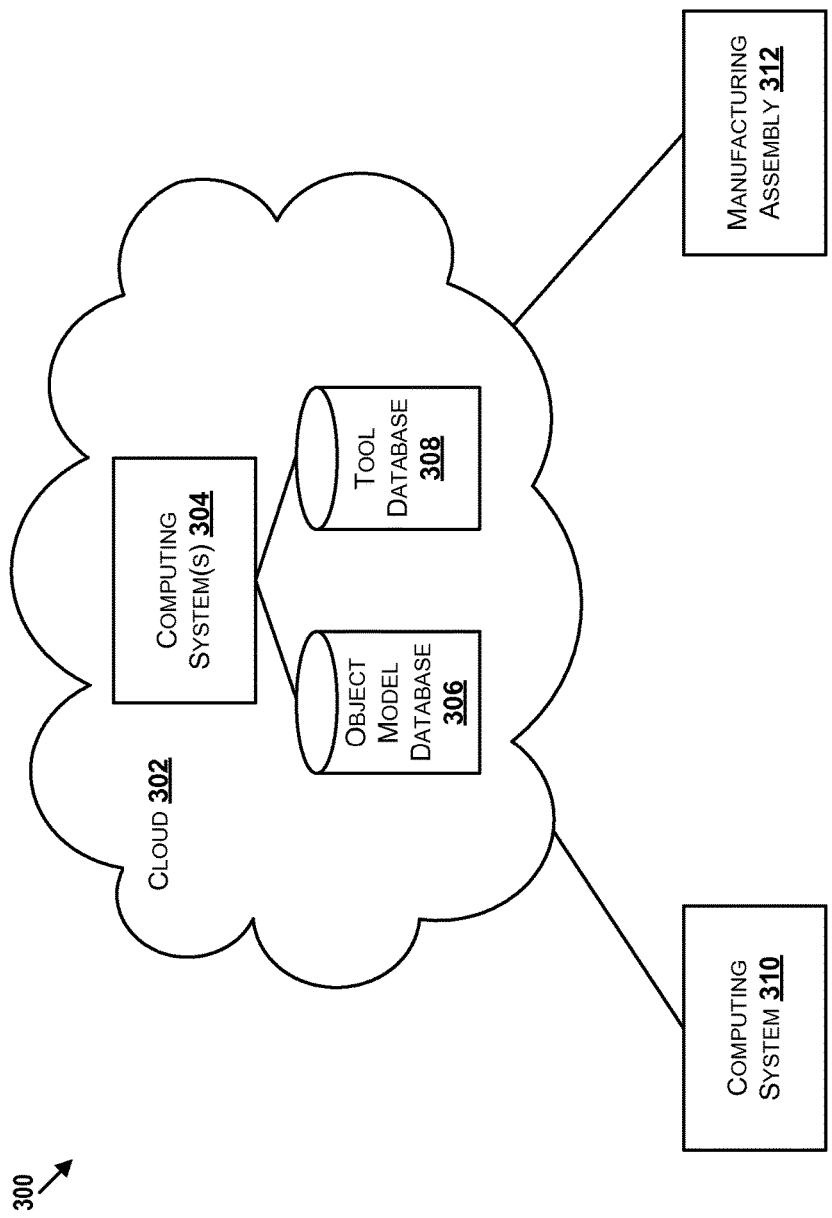
FIG. 3 is an example system in which an example method might be practiced.

FIG. 3 illustrates an example cloud-based computing system 300 in which an example method may be practiced. Cloud-based computing generally refers to networked computer architectures in which application execution and storage may be divided, to some extent, between client and server devices. A "cloud" may refer to a service or a group of services accessible over a network (e.g., Internet) by client and server devices, for example. While a cloud-based computing system is shown by way of example, any suitable system that includes at least one computing system may be used to implement the invention.

In one example, any computer connected to the cloud may be connected to the same pool of computing power, applications, and files. Thus, cloud computing enables a shared pool of configurable computing resources (e.g., networks, servers, storage, applications, and services) that can be provisioned and released with minimal management effort or service provider interaction.

As an example, in contrast to a predominately client-based or server-based application, a cloud-based application may store copies of data and/or executable program logic at remote server devices, while allowing client devices to download at least some of this data and program logic as needed for execution at the client devices. In some examples, downloaded data and program logic can be tailored to capabilities of specific client devices (e.g., a personal computer, tablet, or mobile phone, or robot) accessing the cloud based application. In addition, dividing application execution and storage between the client and server devices allows more processing to be performed by the server devices taking advantage of server devices processing power and capability, for example.

Cloud-based computing can also refer to distributed computing architectures in which data and program logic for a cloud-based application are shared between one or more client devices and/or server devices on a near real-time basis. Parts of this data and program logic may be dynamically delivered, as needed or otherwise, to various clients accessing the cloud-based application. Details of the architecture may be transparent to users of client devices. Thus, a PC user or robot client device accessing a cloud-based application may not be aware that the PC or robot downloads program logic and/or data from the server devices, or that the PC or robot offloads processing or storage functions to the server devices, for example.

In FIG. 3, a cloud 302 includes one or more computing system(s) 304, an object-model database 306 and a tool database 308. The cloud 302 may include more or fewer components, and each of the one or more computing system (s) 304, an object-model database 306 and a tool database 308 may include multiple elements as well. Thus, one or more of the described functions of the one or more computing systems 304 may be divided up into additional functional or physical components, or combined into fewer functional or physical components. In some further examples, additional functional and/or physical components may be added to the examples illustrated by FIG. 3. Delivery of cloud computing may involve multiple cloud components communicating with each other over application programming interfaces, such as web services and three-tier architectures, for example.

The one or more computing systems 304 may be implemented as one or more instances of computing system 100 in FIG. 1 or computing system 200 in FIG. 2, among other examples. In operation, the one or more computing systems 304 may provide a pipeline from a three-dimensional (3-D) model of a given object to a model of one or more fingertips that are specialized to grasp the given object.

The object-model database 306 may include one or more databases configured to store three-dimensional (3-D) models of objects, such as consumer goods. In computer graphics, 3-D modeling involves generation of a representation of a 3D surface of an object. The representation may be referred to as a 3D object data model, and can be rendered or displayed as a two-dimensional image via 3D rendering or displayed as a three-dimensional image. 3D object data models represent a 3D object using a collection of points in 3D space, connected by various geometric entities such as triangles, lines, curved surfaces, etc. (i.e., polygons). Various techniques exist for generating 3D object data models utilizing point clouds and geometric shapes, for examples.

Being a collection of data, 3D models can be created by hand, algorithmically, or objects can be scanned, for example. As an example, an artist may manually generate a 3D image of an object that can be used as the 3D model. As another example, a given object may be scanned from a number of different angles, and the scanned images can be combined to generate the 3D image of the object. As still another example, an image of an object may be used to generate a point cloud that can be algorithmically processed to generate the 3D image.

In some examples, 3D model acquisition (shape and appearance) may be achieved by working with venders or manufacturers to scan objects in 3D. For instance, structured light scanners may capture images of an object and a shape of the object may be recovered using monochrome stereo cameras and a pattern projector. In other examples, a high-resolution DSLR camera may be used to capture images for color texture information. In still other examples, a raw computer-aided drafting (CAD) set of drawings may be received for each object.

3D object data models may include solid models that define a volume of the object, or may include shell or boundary models that represent a surface (e.g., the boundary) of the object. In some cases, a 3D object data model may include a mesh data set defining a dense surface mesh geometry. Such 3D object models may be stored in the object-model database 306. The database 306 may store all data sets for a 3D object data model in any number of various forms from raw data captured to processed data for display. As one example, multiple scans of an object may be processed into a merged mesh and assets data model, and stored in the object-model database 306 in that form. The object-model database 306 may also include, for one or more objects represented in the object-model database 306, data indicating certain textures, colors, shapes, geometries, densities, attributes, etc. for components of the object.

Data representing the object-model database 306 may be stored in one or more data storages. Such data storages may be implemented in one or more computing devices, which may be interconnected with computing system 304 such that computing system 304 may have access to the object-model database 306.

Figure 4:
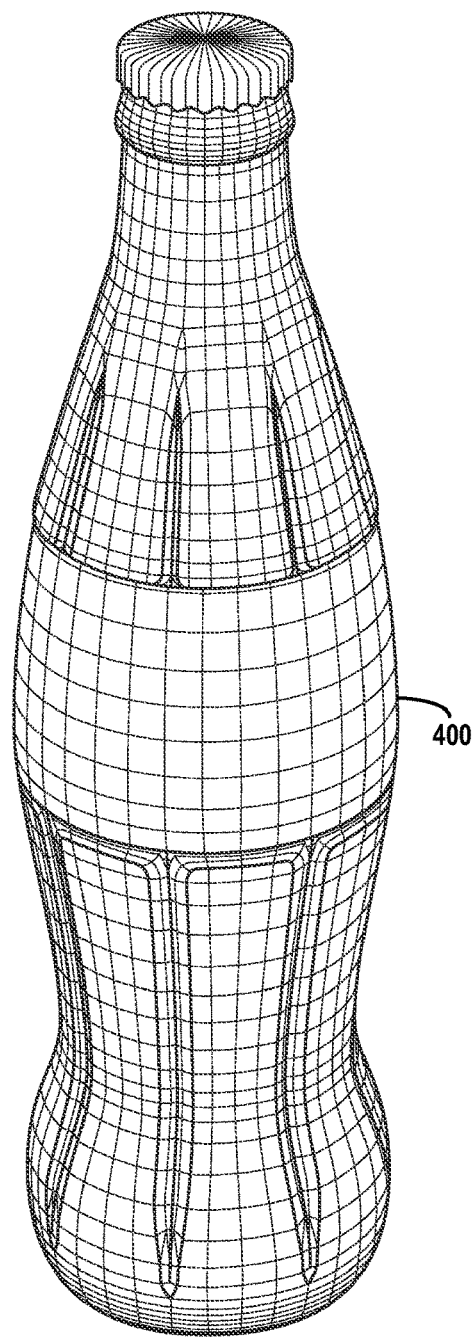
FIG. 4 is an example geometric model of an example object.

FIG. 4 illustrates an example 3-D geometric model 400 of an object (a bottle). As shown, the 3-D geometric model 400 includes a mesh that includes various polygons that together form a surface of the object (the bottle).

Figure 5:
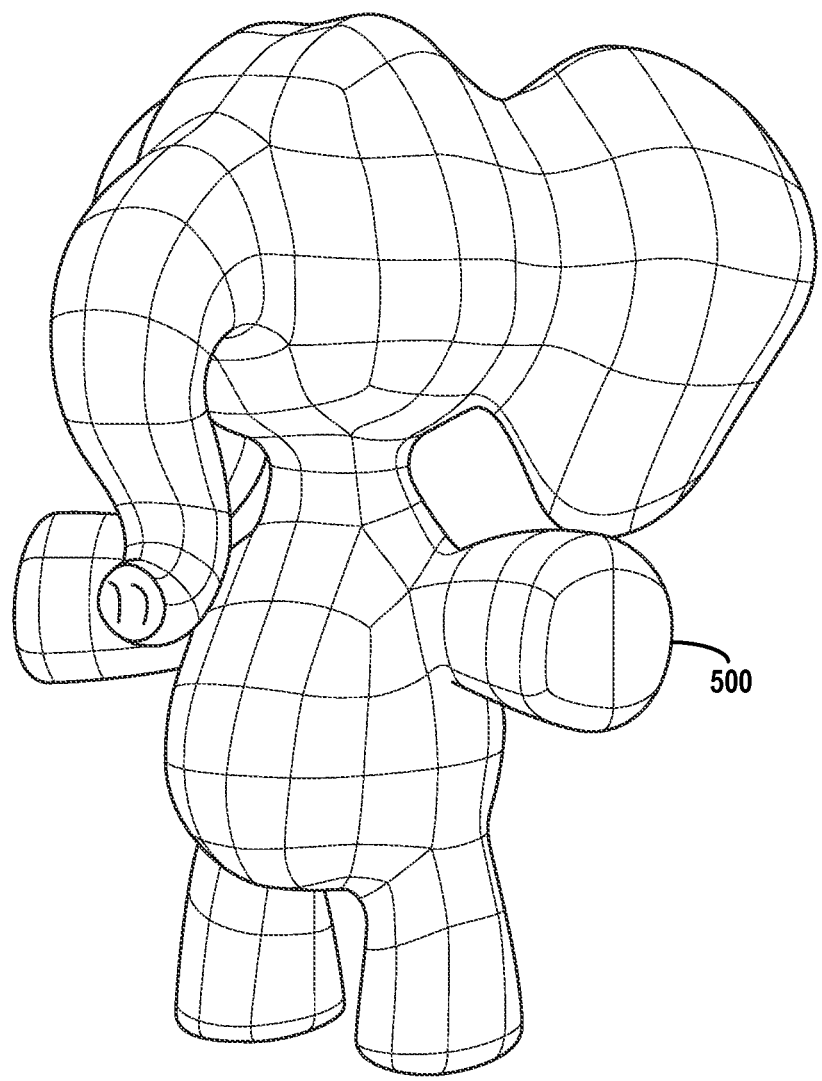
FIG. 5 is an example geometric model of another example object.

FIG. 5 illustrates an example 3-D geometric model 500 of an object (a toy elephant). As shown, the 3-D geometric model 500 includes a mesh that includes various polygons that together define a surface of the toy elephant.

Figure 6:
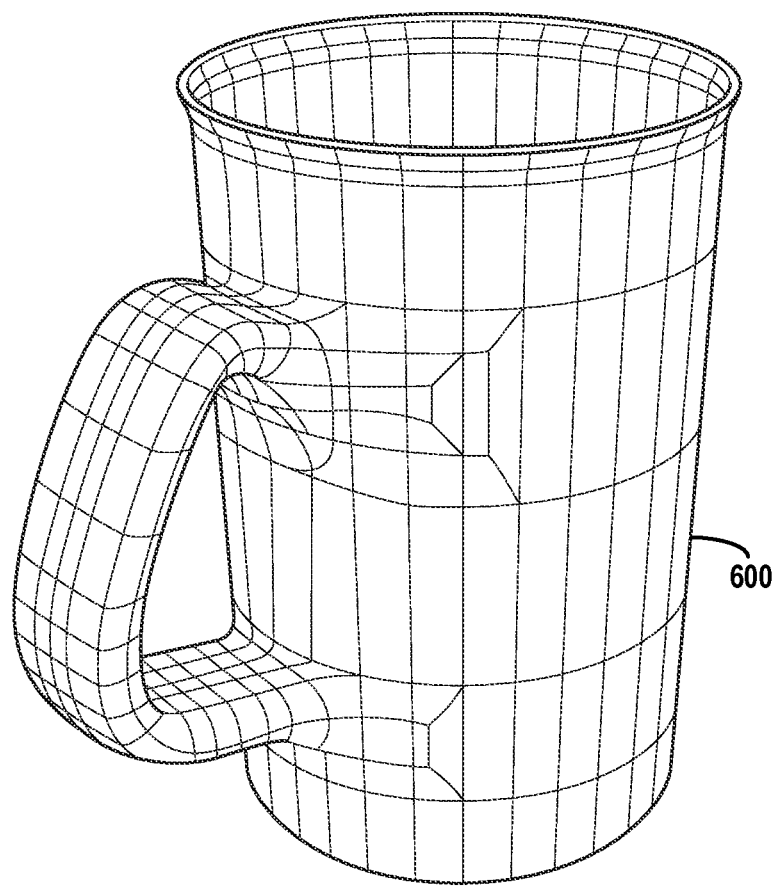
FIG. 6 is an example geometric model of yet another example object.

FIG. 6 illustrates an example 3-D geometric model 600 of an object (a mug). As shown, the 3-D geometric model 600 includes a mesh that includes various polygons that together form a surface of the mug.

FIGS. 4, 5, and 6 present just a few example geometric models of different objects. The object model database may include a model for any 3-D object and may, in some examples, include models of many 3-D objects.

Referring back to FIG. 3, the tool database 308 may include one or more databases configured to store models of fingertips. The models of fingertips may be represented as data in any number of forms, including, for example, the forms noted above in connection with the object model database 306. For instance, the models of fingertips may include respective solid models that define a volume, or respective shell or boundary models that represent a surface (e.g., a boundary).

The system 300 may include a computing system 310 that is communicatively coupled to cloud 302 (and perhaps one or more computing of the components of cloud 302, such as the one or more computing systems 304). Computing system 310 may be implemented as computing system 100 of FIG. 1 or computing system 200 of FIG. 2, among other examples. In some cases, computing system 310 may send data to or receive data from the cloud 302.

The manufacturing assembly 312 may include a system that is configured to produce one or more physical instances of one or more fingertips based on a model of the one or more fingertips. The manufacturing assembly may include one or more machines, devices, or components that facilitate producing such a fingertip set. Manufacturing assembly 312 may include one or more computing systems that are configured to receive one or more models of respective fingertip sets. As shown, manufacturing assembly 312 may be communicatively coupled to cloud 302. Such a connection may include a connection to the one or more computing systems 304. In some cases, manufacturing assembly 312 may send data to or receive data from the cloud 302. For instance, the manufacturing assembly 312 may receive data representing one or more models of respective fingertip sets for production. In some cases, manufacturing assembly 312 may include one or more 3-D printers.

Figure 7:
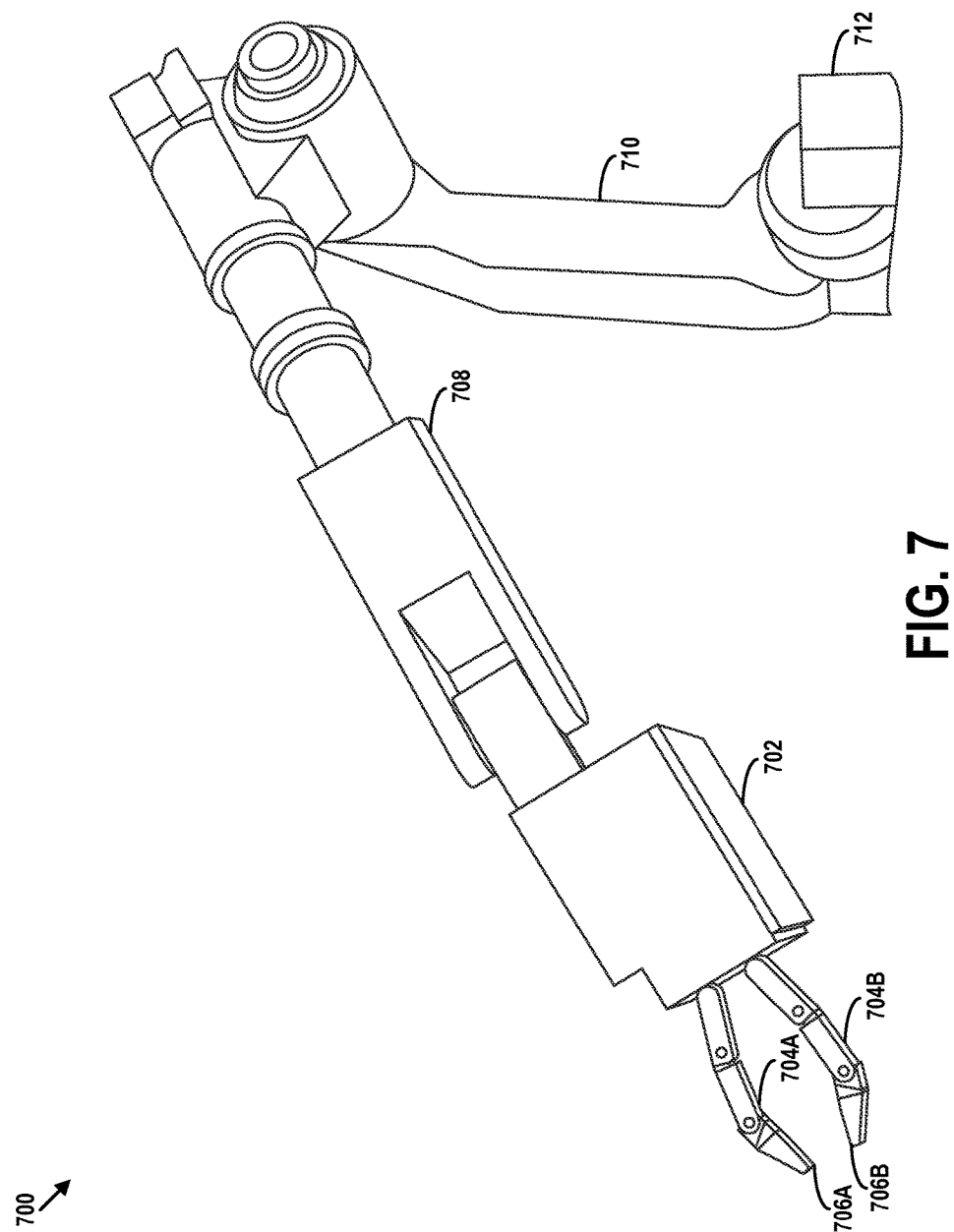
FIG. 7 is a perspective view of an example robotic arm having an example end-effector that includes fingers having respective fingertips.

FIG. 7 illustrates an example robotic arm 700 having an example end-effector 702 that includes finger 704A and finger 704B. In some cases, end-effector 702 may manipulate (e.g., grasp) objects by way of fingers 704A and 704B. Fingers 704A and 704B include respective joints about which members of the fingers may rotate to move fingers 704A and 704B relative to one another. Fingers 704A and 704B include fingertips 706A and 708A, respectively. During a grasp of an object by fingers 704A and 704B, fingertips 706A and 708A may contact the object so as to grasp it.

Robotic arm 700 includes a first member 708 and a second member 710. The first member 708 is rotatably coupled to the second member 710. The second member is rotatably coupled to a base 712. The robotic arm may rotate the members 708 and 710 in relation to one another and in relation to the base 712 to position the end-effector 702, perhaps to grasp an object.

Figure 8:
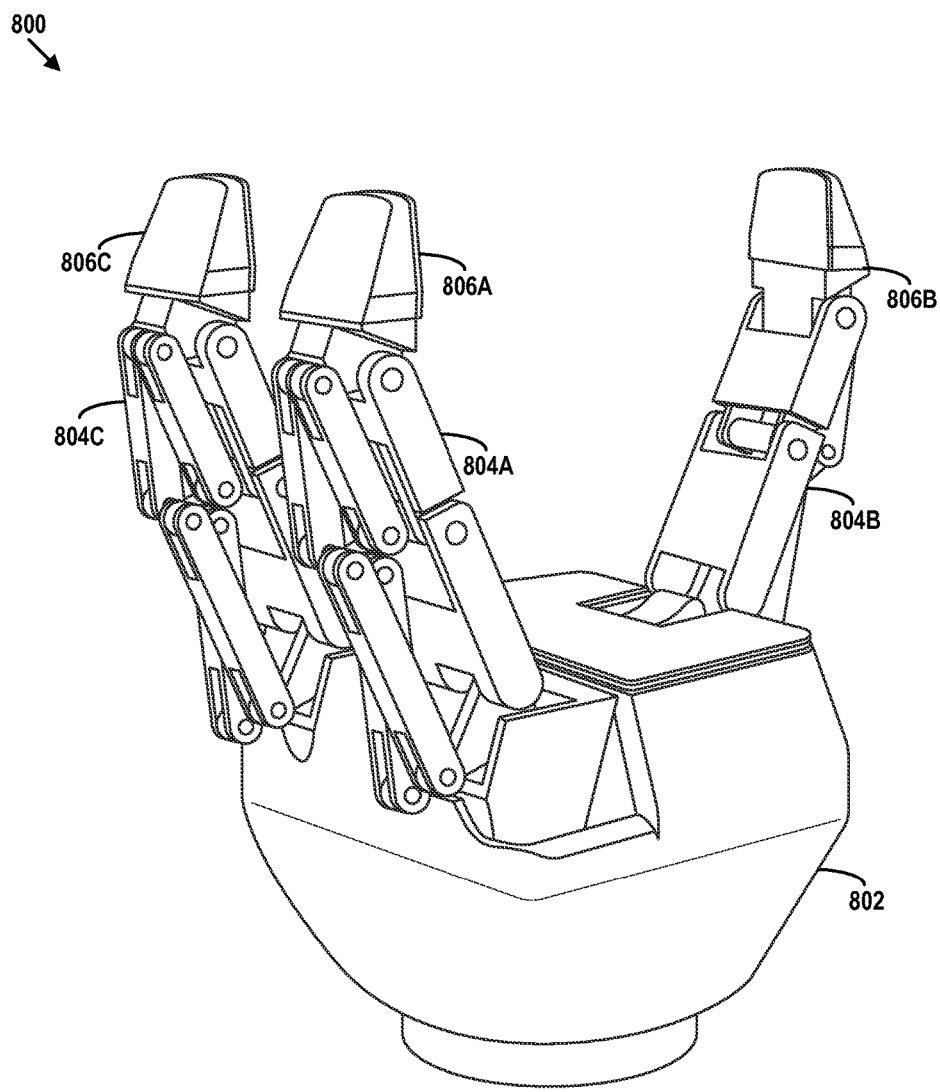
FIG. 8 is a perspective view of another example end-effector that includes fingers having respective fingertips.

FIG. 8 illustrates another example end-effector 800. End-effector 800 includes a base 802 to which fingers 804A, 804B, and 804C are connected. Fingers 804A, 804B, and 804C include example fingertips 806A, 806B, and 806C, respectively. As shown, fingertips 806A, 806B, and 806C have a different geometry (shape) than fingertips 706A and 708A of FIG. 7. Due to this different geometry, fingertips 806A, 806B, and 806C may be better suited to grasping certain objects than fingertips 706A and 708A. For instance, fingertips 806A, 806B, and 806C may provide a relatively stronger grip (e.g., such fingertips may provide a grip that can be maintained under higher forces acting up the grasped object).

Figure 9:
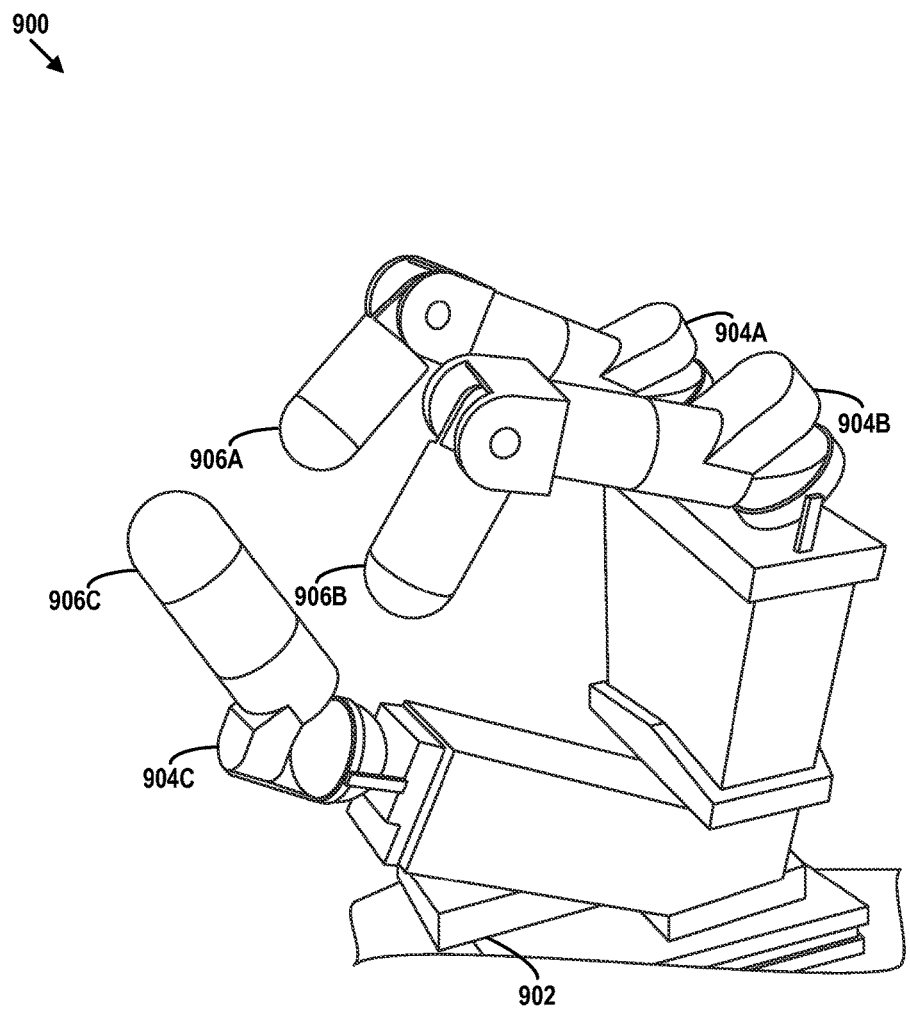
FIG. 9 is a perspective view of yet another example end-effector that includes fingers having respective fingertips.

FIG. 9 illustrates another example end-effector 900. End-effector 900 includes a base 902 to which fingers 904A, 904B, and 904C are connected. Fingers 904A, 904B, and 904C include example fingertips 906A, 906B, and 906C, respectively. As shown, fingertips 906A, 906B, and 906C have a different geometry (e.g., shape) and size than fingertips shown in FIGS. 7 and 8. Fingertips 906A, 906B, and 906C may also be made of a different material. Due to these different characteristics, fingertips 906A, 906B, and 906C may be better suited to grasping certain objects than other fingertips.

Figure 10:
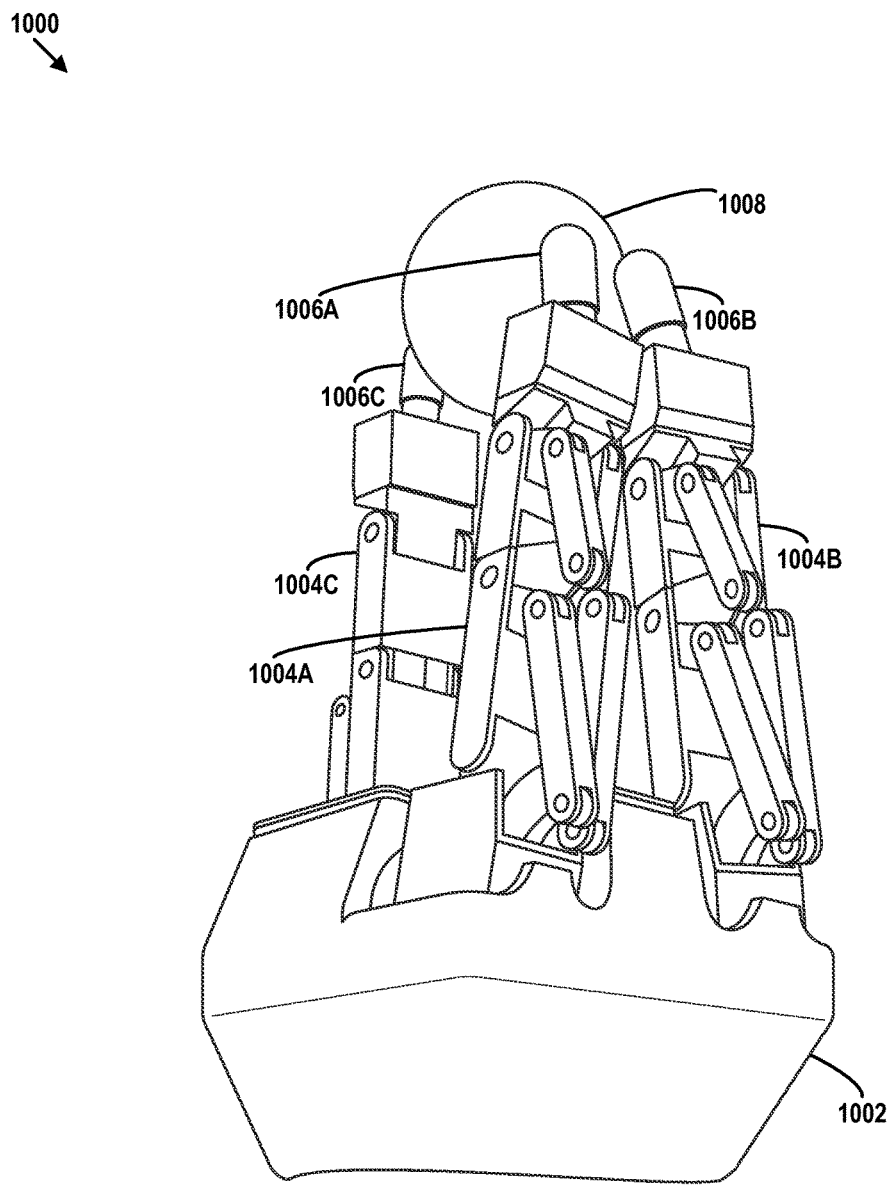
FIG. 10 is a perspective view of still another example end-effector that includes fingers having respective fingertips.

FIG. 10 illustrates yet another example end-effector 1000. End-effector 1000 includes a base 1002 to which fingers 1004A, 1004B, and 1004C are connected. Fingers 1004A, 1004B, and 1004C include fingertips 1006A, 1006B, and 1006C, respectively. As shown, fingertips 1006A, 1006B, and 1006C have a different geometry and size than fingertips shown in FIGS. 7, 8, and 9. Fingertips 1006A, 1006B, and 1006C may also be made of a different material. Due to these different characteristics, fingertips 1006A, 1006B, and 1006C may be better suited to grasping certain objects than other fingertips, such as a ball 1008.

Figure 11:
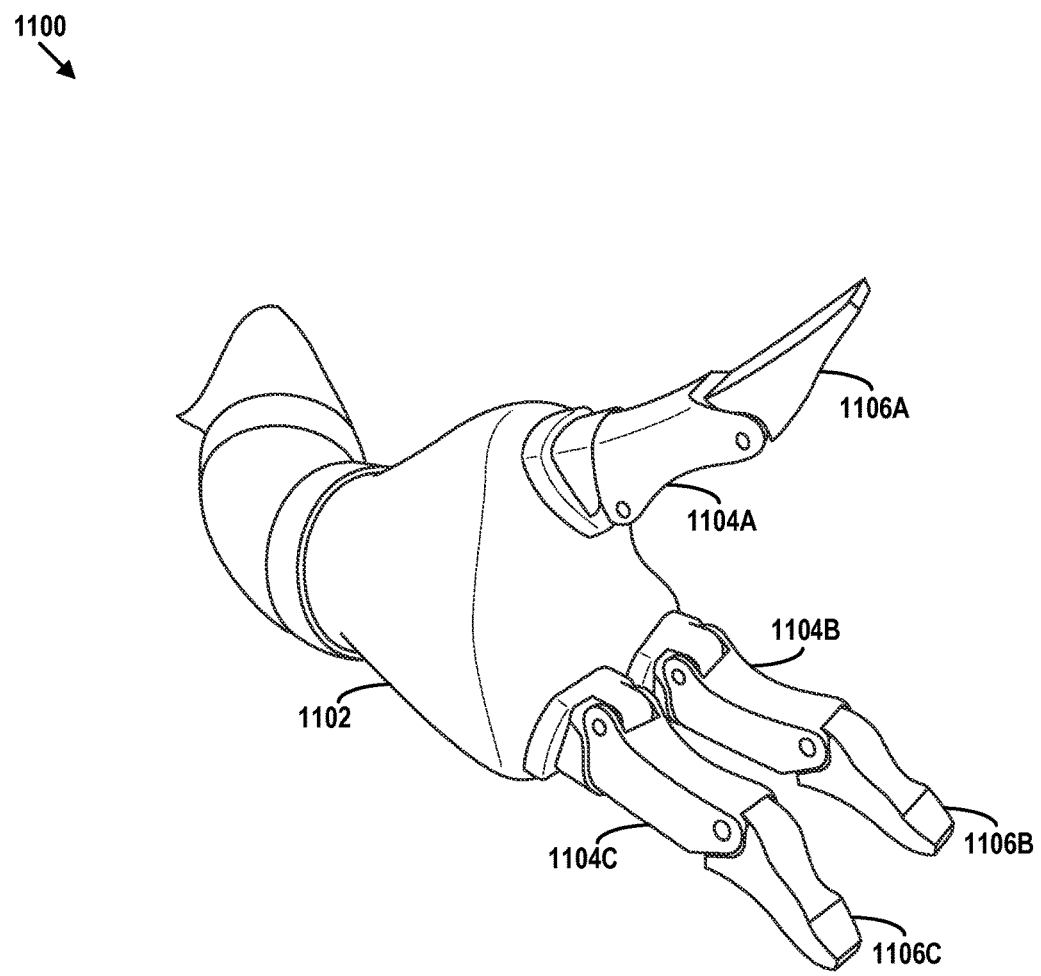
FIG. 11 is a perspective view of another example end-effector that includes fingers having respective fingertips.

FIG. 11 illustrates another example end-effector 1100. End-effector 1100 includes a base 1102 to which fingers 1104A, 1104B, and 1104C are connected. Fingers 1104A, 1104B, and 1104C include fingertips 1106A, 1106B, and 1106C, respectively. As shown, fingertips 1106A, 1106B, and 1106C have a different geometry and size than fingertips shown in FIGS. 7, 8, 9, and 10. Fingertips 1106A, 1106B, and 1106C may also be made of a different material. Due to these different characteristics, fingertips 1106A, 1106B, and 1106C may be better suited to grasping certain objects than other fingertips.

Figure 12:
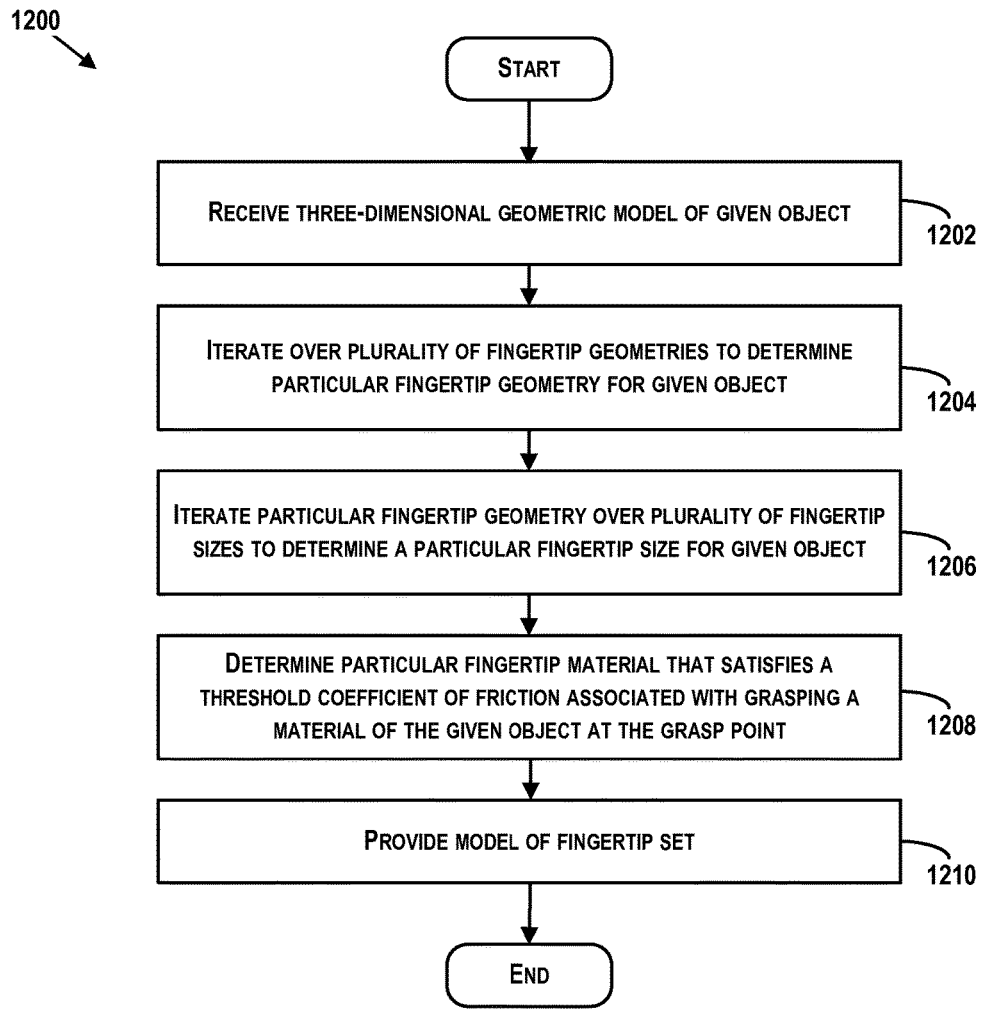
FIG. 12 is a flow chart illustrating an example method to provide a pipeline from a three-dimensional geometric model of a given object to a model of one or more fingertips that are specialized to grasp the given object.

FIG. 12 is a block diagram of an example method 1200 to provide a pipeline from a three-dimensional (3-D) model of a given object to a model of one or more fingertips that are specialized to grasp the given object, in accordance with at least some embodiments described herein. Method 1200 shown in FIG. 12 presents an embodiment of a method that, for example, could be used with a computing system, such as computing system 100 containing program code 108 for method 1200 in FIG. 1 or computing system 200 containing program code 212 for method 1200 in FIG. 2, among other examples. Method 1200 may include one or more operations, functions, or actions as illustrated by one or more blocks of 1202-1210. Although the blocks are illustrated in a sequential order, these blocks may in some instances be performed in parallel, and/or in a different order than those described herein. Also, the various blocks may be combined into fewer blocks, divided into additional blocks, and/or removed based on the desired implementation.

In addition, for the method 1200 and other processes and methods disclosed herein, the flowchart shows functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include a non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, a tangible storage device, or other article of manufacture, for example. The program code (or data for the code) may also be stored or provided on other media including communication media, such as a wireless communication media, for example.

In addition, for the method 1200 and other processes and methods disclosed herein, each block in FIG. 12 may represent circuitry that is wired to perform the specific logical functions in the process.

Functions of the method 1200 may be fully performed by a processor of a computing system, or may be distributed across multiple components of a computing system. In some examples, the functions of method 1200 may be distributed across multiple computing systems and/or a server.

At block 1202, the method 1200 involves receiving a three-dimensional geometric model of a given object. The object may be any three-dimensional object. The three-dimensional geometric model may include data representing the given object, such as any of the example three-dimensional models discussed above in connection with object model database 306 of FIG. 3. For instance, one or more computing systems 304 of FIG. 3 may receive a three-dimensional geometric model of a given object by way of an interface, such as interface 202 of FIG. 2, perhaps from another computing system (e.g., a computing system that includes a data storage having one or more three-dimensional geometric models stored therein). Alternatively, a processor (e.g., the one or more processors 206 of FIG. 2) may receive a three-dimensional geometric model from a data storage (e.g., data storage 204) by way of a communication link (e.g., communication link 210). Other examples are possible as well.

In some cases, receiving a three-dimensional geometric model of the given object may involve a computing system receiving, over a network interface, an indication of a given object from a second computing system. For instance, the one or more computing systems 304 may receive an indication of an object from computing system 310. Computing system 310 might detect input indicating a particular object for which one or more fingertips for grasping the object are requested and then send an indication of the particular object to the one or more computing systems 304. The indication of the object may be any data that identifies an object, such as a number, code, name, or description.

After receiving the indication of the given object, the computing system may determine whether a geometric-model database includes a three-dimensional geometric model for the given object. For instance, the one or more computing systems 304 may query object model database 306 for a three-dimensional geometric model of the given object. In some cases, the object model database 306 may include a three-dimensional geometric model of the given object. In such cases, the object model database 306 may retrieve the three-dimensional geometric model for the given object from geometric-model database 306.

In other cases, a computing system may determine that a geometric-model database excludes the three-dimensional geometric model for the given object. For instance, the one or more computing systems 304 may query object model database 306 for a three-dimensional geometric model of the given object, and the query may indicate that a three-dimensional geometric model of the given object is not available in the object model database 306. In such cases, the computing system may request the three-dimensional geometric model for the given object from the particular computing system. For instance, the one or more computing systems 304 may send a request to computing system 310 for a three-dimensional geometric model (perhaps in one or more supported data formats, such as those discussed above). In some examples, the request for a three-dimensional geometric model may cause an interface to display a prompt for a three-dimensional geometric model, perhaps by altering the content of a web page or the like.

In some examples, the computing system may determine whether a tool database includes or excludes a model of one or more fingertips for the given object. For instance, the one or more computing systems 304 may query tool database 308 to determine whether the tool database 308 includes a model of one or more fingertips for the given object. As noted above, the tool database 308 may include a plurality of models of respective fingertip sets, which may be cross-referenced to particular objects that they are designed to grasp. Such fingertip models may be pre-computed using various techniques. Some models might be manually designed (e.g., by hand) and then stored in the tool database 308. Other models might be designed using the techniques described in this disclosure and then stored in the tool database 308. Storing pre-computed fingertip models might make certain aspects of the pipeline from a three-dimensional (3-D) model of a given object to a model of one or more fingertips that are specialized to grasp the given object redundant, thereby speeding up the pipeline. Fingertips 806A, 806B, and 806C of FIG. 8, fingertips 906A, 906B, and 906C of FIG. 9, fingertips 1006A, 1006B, and 1006C of FIG. 10, and fingertips 1106A, 1106B, and 1106C of FIG. 11 each present examples of fingertips for which models might be stored in a tool database.

In some cases, the tool database may include a model of one or more fingertips (or models of multiple fingertip sets, perhaps for different grasp applications) for the given object. In such cases, the computing system may perform one or more operations to facilitate providing that model. In some cases, the computing system may query the tool database for the model of the one or more fingertips for grasping the given object. For instance, the one or more computing systems 304 of FIG. 3 may query tool database 308 for one or more fingertips for grasping an object and retrieve the queried model from the tool database 308.

In some cases, the computing system may provide the queried model of the one or more fingertips for grasping the given object. In some cases, providing the queried model may involve sending the model of the one or more fingertips to a particular computing system (e.g., the computing system from which the indication of the given object was received. For instance, the one or more computing systems 304 of FIG. 3 may send the queried model to computing system 310. In other cases, providing the queried model may involve sending the model of the one or more fingertips to a manufacturing assembly (e.g., manufacturing assembly 312 of FIG. 3).

The manufacturing assembly may receive the queried model, perhaps by way of a computing system, and, in some cases, may produce one or more physical instances of the one or more fingertips. For instance, a 3-D printer, plastic injection molding machine, computer numerical control (CNC) machine may produce one or more physical instances. Alternatively, the manufacturing assembly may include a collection of one or more machines or apparatuses configured to produce fingertip based on models of the fingertips. In some cases, the computing system may send, over a network interface, data representing instructions to produce the one or more fingertips on the manufacturing assembly. Such instructions may cause the manufacturing assembly to produce one or more physical instances of the queried model.

In other cases, the tool database might not include a model of one or more fingertips for grasping the given object. Based on determining that the tool database excludes a model of the one or more fingertips for the given object, a computing system may perform one or more operations to produce a model of one or more fingertips for the given object. Such operations may include causing various modules to determine aspects of the one or more fingertips. Such operations may be referred to as morphogenesis.

In FIG. 12, at block 1204, the method may involve iterating over a plurality of fingertip geometries to determine one or more particular fingertip geometries for the given object. In some examples the computing system may determine one or more particular fingertip geometries that are compliant to a shape of the given object at a grasp region on the given object. A factor in achieving a grasp of the object is compliance between the shape of the given object at the grasp region and the one or more fingertip geometries of the fingertips that contact the object at the grasp region. A match between these shapes tends to produce a stronger grasp while a mismatch tends to produce a weaker grasp. Having particular fingertip geometries that are compliant to the object may result in a stronger and more repeatable grasp. By iterating over a plurality of geometries, the module may try a number of different geometry is compliant to the object to be grasped. The geometries may include a variety of different geometries including relatively flat fingertips (e.g., fingertips 806A, 808B, and 808C of FIG. 8) or fingertips that are composed of various curved surfaces (e.g., fingertips 906A, 906B, and 906C of FIG. 9 or fingertips 1006A, 1006B, and 1006C of FIG. 10, among other examples).

Figure 13:
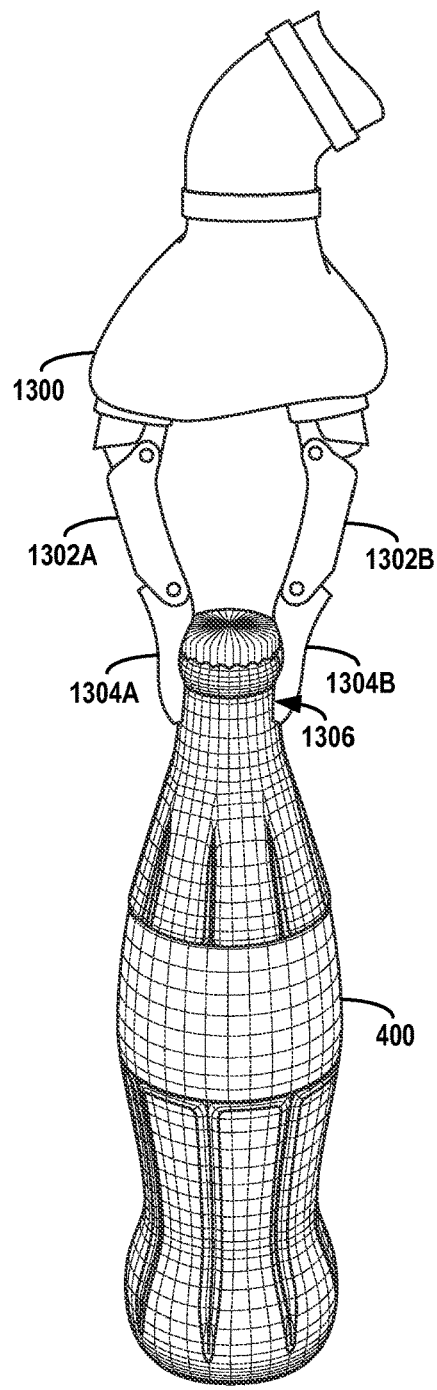
FIG. 13 is an example end-effector that includes fingers having respective fingertips that are grasping a geometric model of an example object.

FIG. 13 illustrates an example grasp of the bottle 400 of FIG. 4 by an end-effector 1300. The end-effector 1300 includes fingers 1302A and 1302B, which include fingertips 1304A and 1304B. As shown, fingertips 1304A and 1304B include respective profiles of contact patches that protrude from respective fingers of an end-of-arm-tool so as to contact the bottle 400 during a grasp. Also as shown, fingertips 1304A and 1304B are compliant to the bottle 400 at a grasp region 1306 (i.e., the neck of the bottle).

The plurality of fingertip geometries may include a finite number of different fingertip geometries represented by data that the computing system maintains or has access to. The fingertip geometries may be represented as data in any number of forms, including, for example, the forms noted above in connection with the object model database 306 and tool database 308. For example, the fingertip geometries may include respective solid models that define a volume, or respective shell or boundary models that represent a surface (e.g., a boundary).

The grasp region may include a region at which robotic fingertips might contact a given object during a grasp. For instance, in some cases, the grasp region may include a region extending around a perimeter of the object. During a grasp, a robotic manipulator may position an end-effector such that robotic fingers of the end-effector are in proximity to the grasp region. To cause a grasp, the robotic fingers may close around the object to cause the robotic fingertips to make contact with the grasped object at one or more grasp points on the object. For instance, a robotic manipulator may position end-effector 1300 such that robotic fingers 1302A and 1302B are near the grasp region 1306. During a grasp, robotic fingers 1302A and 1302B may close around the neck of the bottle so as to cause fingertips 1304A and 1304B to contact the bottle 400 as shown.

In some cases, the computing system may be seeded with a context for the grasp. Such a context might include a grasp region, particular grasp points on the object, or perhaps the grasp direction (i.e., the direction from which an end-effector performing a grasp of the object will approach the object). For instance, the one or more computing systems 304 of FIG. 3 may receive data indicating grasp points on the object, perhaps from computing system 310. In some examples, computing system 310 may detect input indicating such grasp points, and send data indicating the grasp points to the one or more computing systems 304. Some objects may have multiple possible grasp regions. Limiting the computing system to a particular grasp region may reduce the number of iterations involved in determining the one or more particular fingertip geometries. For instance, referring back to FIG. 5, toy elephant 500 might be grasped around its head, by either of its ears, by either of its arms, or by either of its legs, among other possibilities. In such an example, identifying a region around its head as the grasp region eliminates these possibilities from the iterations.

Alternatively, a computing system may determine a grasp region on the given object based on a grasp direction. A particular grasp direction may facilitate positioning the grasped object in particular ways. For instance, grasping bottle 400 by its neck may facilitate loading bottle 400 into packaging, such as a cardboard six-pack box. As another example, grasping toy elephant 500 around its head may facilitate setting toy elephant 500 down upright, perhaps to load toy elephant 500 into packaging. Determining the grasp region may involve simulating an approach of the end-effector toward the object via the grasp direction. The computing system may further simulate closing fingers around the object to determine at what points the fingers make contact with the grasp object. Such points may indicate the grasp region. In some cases, the computing system may simulate multiple grasps using fingers of different dimensions to determine the grasp region.

In some cases, the grasp region may be asymmetrical (e.g., a grasp region of toy elephant 500 that extends around a perimeter of the head of toy elephant 500). In such cases, a grasp of the object might be improved by having fingertips with two or more different fingertip geometries. For example, a fingertip set of two or more fingertips might include fingertips having a first shape and a second shape. Determining such a fingertip set may involve iterating over the plurality of fingertip geometries to determine a first fingertip geometry that is compliant to a first shape of the given object at a first grasp point within the grasp region and iterating over the plurality of fingertip geometries to determine a second fingertip geometry that is compliant to a second shape of the given object at a second grasp point within the grasp region.

In some examples, the number of fingers on the end-effector used to grasp the given object might not be predetermined. In such cases, the computing system may determine an end-effector to use in the grasp. Determining the end-effector might be based on a number of fingertips to include in the fingertip set. Such a determination may be based on the geometry of the grasp region. A two finger end-effector might be suitable for certain objects, such as the bottle 400, having grasp regions with relatively small perimeters and/or a grasp region made of a rigid material. In such cases, three or more fingertips might interfere with one another during a grasp. End-effectors having three or more fingertips might be suitable for other objects, such as those having grasp regions with larger perimeters or those having grasp region made of a softer material, as multiple fingertips may balance the gripping force around the grasp region perimeter. Multiple fingers may also provide a more repeatable grasp. For instance, grasping the toy elephant 500 with three fingers may result in a more repeatable grasp than grasping the toy elephant 500 with two fingers. Such a grasp might be more repeatable because the toy elephant 500 is less likely to move relative to the fingertips during a grasp when there are three or more fingertips involved in the grasp.

In some examples, certain fingertip geometries are mapped to objects of given dimensions. Different dimensions might map objects to different size ranges, which may in turn be mapped to different fingertip geometries. For instance, given an object having a particular width, length, and height, such dimensions might put the object in a certain range to which one or more fingertip geometries are mapped. Such mapping of object dimensions to fingertip geometries might be used in selecting a fingertip geometry, or identifying a set of fingertip geometries over which to iterate.

In some examples, the computing system may include a grasp planner module configured to simulate grasps of objects by robotic fingers. In such cases, for respective fingertip geometries of the plurality of fingertip geometries, a computing system may simulate respective grasps of the given object by the fingertip geometries to determine respective metrics that indicate respective qualities of grasp of the given object at the grasp point by the fingertip geometries. To facilitate performing such simulations, the computing system may represent a model of the given object and a model of an end-effector having one or more fingertip geometries to be simulated in a virtual three-dimensional space. An example simulation may involve causing fingers of the end-effector to close around the model of the given object.

The computing system may iteratively change the fingertip geometry and simulate grasps with the different fingertip geometries. The metrics that indicate respective qualities of grasp of the given object may relate to forces that a grasp is able to withstand. During a simulation, multiple forces may act against the grasp. For instance, gravitational force may act on the object and may vary based on the mass of the object. Some applications may involve positioning or re-positioning the end-effector during a grasp so as to move the grasp object. During the movement, forces may act against the grasp. Such forces may be proportional to the acceleration that the object experiences. Typically, a more compliant geometry will be able to maintain the grasp under higher forces. The sum of forces acting upon an object may be referred to as the wrench. The wrench may be partitioned into two parts: a contact wrench, which include the forces acting upon the object by the grasp, and a non-contact wrench, which includes the inertial forces acting upon the object.

In some cases, a simulated grasp may be a form closure grasp. A form closure grasp (also known as a power grasp or enveloping grasp) is a grasp in which the grasped object is unable to be moved in any direction, as the fingertips form a grasp that envelops the object. To establish a form closure, the number of contact points should exceed the number of degrees of freedom of the object (e.g., 6). However, such a condition is not sufficient for form closure, as if all of the contact points are on one side of an object, form closure will not be established. An object can also be partly form closed if a grasp restricts an object in one or more degrees of freedom.

In some cases, simulating the grasps may involve testing the candidate grasps for form closure and/or force closure and ranking them so that a grasp can be chosen. A Grasp Matrix G may represent the object twist (or forces of the object) relative to the contact points. A matrix $\lambda$ may represent the contact forces. Then, force closure exists if $G\lambda=0$ and $\lambda>0$. An example metric by which force closures may be ranked is the magnitude of the smallest component of the contact forces, given that a force closure is established.

In other cases, a simulated grasp may be a force closure grasp. A force closure grasp includes friction and relies upon the ability of the fingers to squeeze the object to produce frictional force. Fewer contact points are needed for force closure, as friction forces can help balance the object wrench.

In some cases, in determining respective metrics for simulated grasps, the computing system may further search over a set of control parameters to execute a grasp in simulation. Such control parameters may include the force-torque wrench to be applied at the fingertips (e.g., the force-torque wrench to balance out the object wrench to maintain the grasp). For example, the computing system may iterate over a range of control parameters that apply differing force-torque wrenches at the fingertips to determine a particular set of control parameters that consistently maintains a grasp at a particular grasp point during a simulation. Such control parameters may ultimately be provided along with the fingertips.

Referring to FIG. 12, at block 1206, the method may involve iterating the one or more particular fingertip geometries over a plurality of fingertip sizes to determine one or more particular fingertip sizes for grasping the given object. The computing system may determine one or more particular fingertip sizes that are compliant to one or more dimensions of the given object at the grasp region of the given object. For instance, the computing system may adjust one or more dimensions of the particular fingertip geometry by an increment over a range of fingertip sizes. Such an operation may grow or shrink the fingertip geometry, which may result in grasps of differing quality.

To determine a particular fingertip size, the computing system may simulate respective grasps of the given object by the particular fingertip geometry over the range of fingertip sizes to determine respective metrics that indicate respective qualities of grasp of the given object at the grasp point by the fingertip sizes of the range. As noted above with respect to simulating grasp with different fingertip geometries, such metrics may be based on forces that the grasp is able to withstand. The range may include a particular number of different sizes of fingertips, each differing from one another by an increment. In some cases, the computing system may increment one or more of length, width, or depth of the fingertip so as to grow or shrink the fingertip in or more particular dimensions. In other cases, the computing system may increment these dimensions in the same simulation so as to grow or shrink the shape as a whole. In some examples, the range of dimension over which the computing systems iterates might be based on the dimensions of the object.

Figure 14:
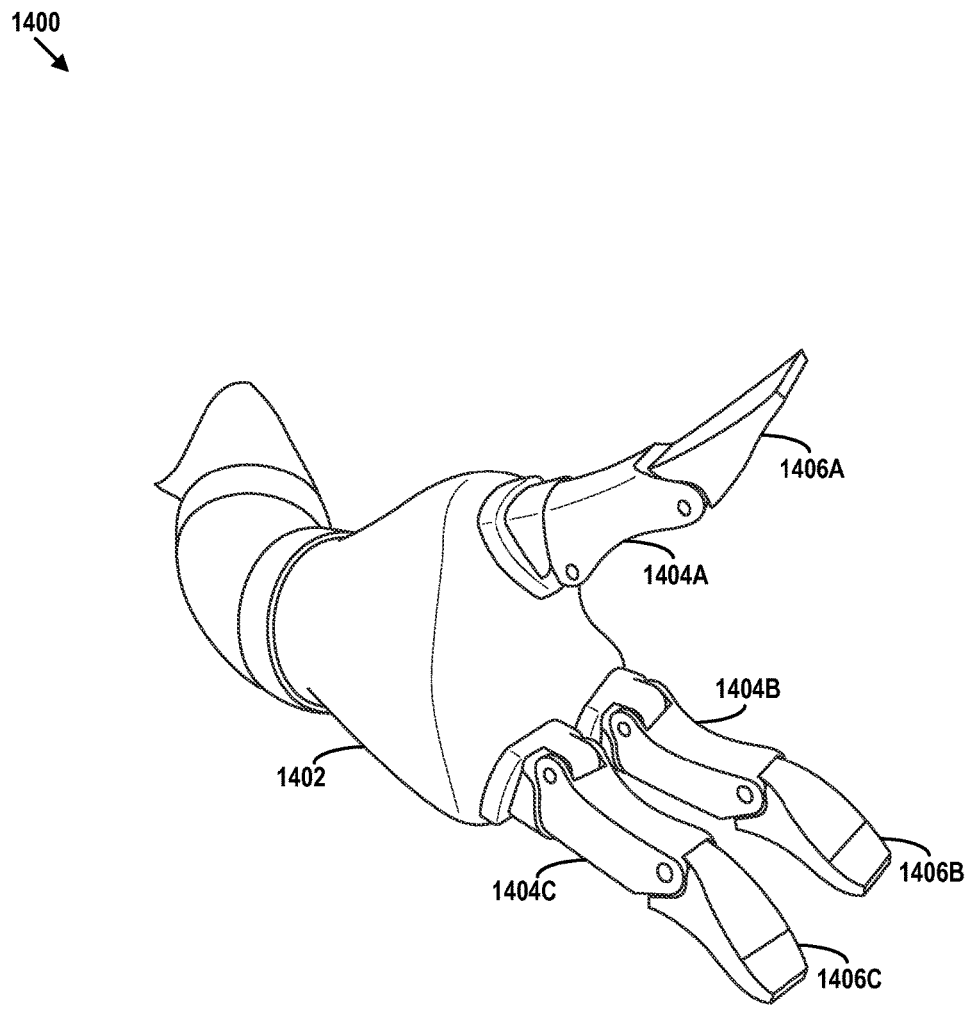
FIG. 14 is a perspective view of an example end-effector that includes fingers having respective fingertips of a first size.
Figure 15:
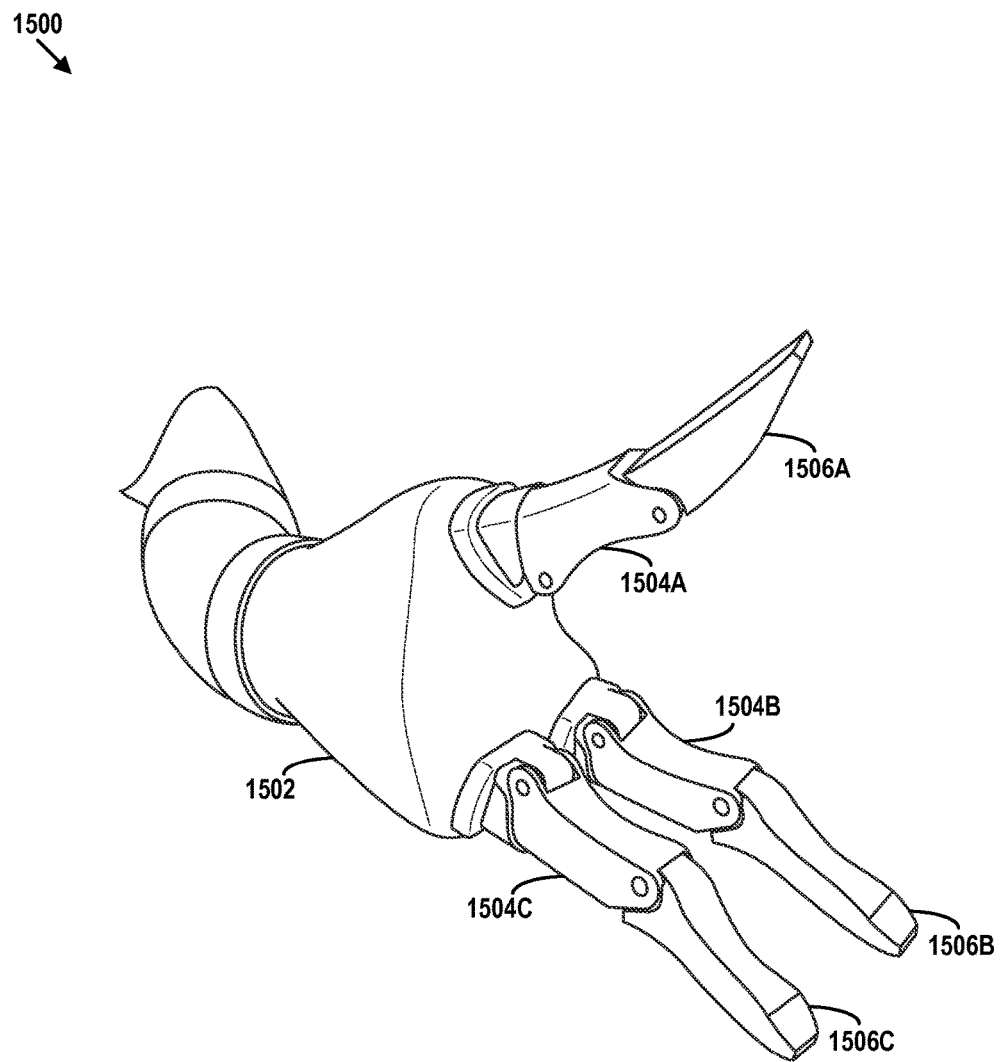
FIG. 15 is a perspective view of an example end-effector that includes fingers having respective fingertips of a second size.
Figure 16:
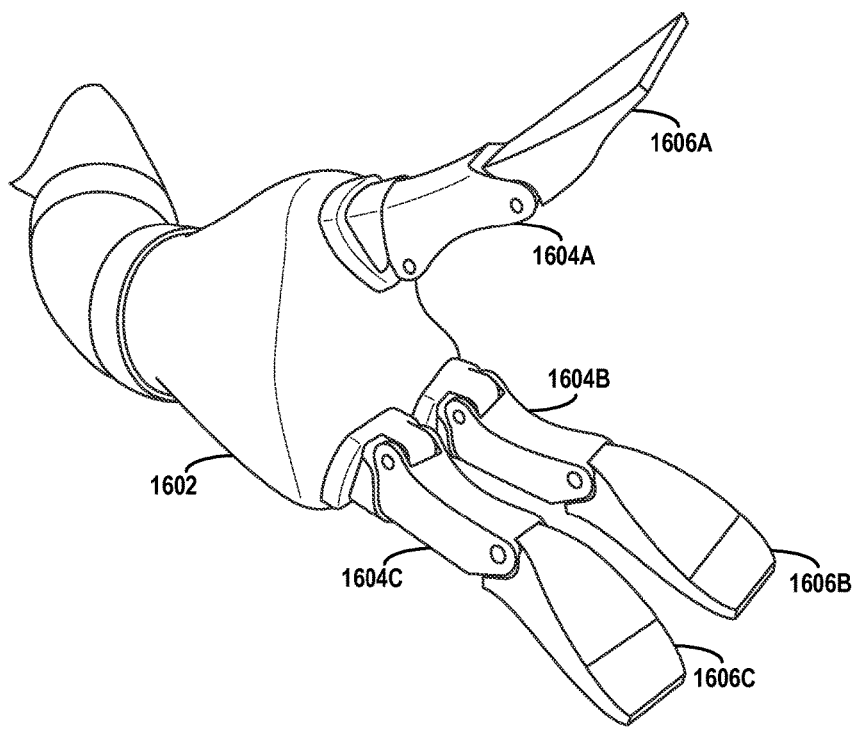
FIG. 16 is a perspective view of an example end-effector that includes fingers having respective fingertips of a third size.

FIGS. 14, 15, and 16 provide examples of end-effectors with fingertips of varying sizes. FIG. 14 shows an end-effector 1402 that includes fingers 1404A, 1404B, and 1404C connected to a base 1402. Fingers 1404A, 1404B, and 1404C include fingertips 1406A, 1406B, and 1406C, respectively. FIG. 15 shows an end-effector 1500 that includes fingers 1504A, 1504B, and 1504C connected to a base 1502. Fingers 1504A, 1504B, and 1504C include fingertips 1506A, 1506B, and 1506C, respectively. Compared with fingertips 1406A, 1406B, and 1406C, fingertips 1506A, 1506B, and 1506C have the same general geometry, but are longer and narrower. FIG. 16 shows an end-effector 1600 that includes fingers 1604A, 1604B, and 1604C connected to a base 1602. Fingers 1604A, 1604B, and 1604C include fingertips 1606A, 1606B, and 1606C, respectively. Compared with fingertips 1406A, 1406B, and 1406C and fingertips 1506A, 1506B, and 1506C, fingertips 1606A, 1606B, and 1606C have the same general geometry, but are shorter and wider. These fingertips present several examples of different fingertip sizes to illustrate how the fingertip sizes might be changed from iteration to iteration.

In alternative embodiments, blocks 1204 and 1206 might not be performed. Instead, the computing system might receive an indication of a particular fingertip geometry and/or a particular fingertip size. The particular fingertip geometry and size for a given object might be pre-determined for the object, or the geometry and size might be determined by another computing system. Alternatively, the geometry and size may be determined manually.

In FIG. 12, at block 1208, the method may further involve determining a particular fingertip material that satisfies a threshold coefficient of friction associated with grasping a material of the given object at the grasp point. In some examples, the computing system may iterate the one or more fingertips over a plurality of materials having respective coefficients of friction to determine a particular material having a coefficient of friction with the material of the given object at the grasp point that is satisfies (e.g., meets or exceeds) the threshold coefficient. The object model may indicate the material (or materials) of the object at various grasp points within the object The threshold coefficient may be pre-determined based on the forces involved in an application. For example, an application that involves higher forces acting against the grasp may suggest a higher coefficient of friction threshold. In other cases, the threshold may be pre-determined as a minimum coefficient acceptable to a grasp.

Further, some fingertip materials might form higher quality grasps with certain object materials. For example, in some cases, relatively soft materials (such as rubber or foam) might form a higher quality grasp with a rigid object (e.g., a metal, plastic, or glass object). As such fingertip materials may have a higher coefficient of friction with such object materials. Conversely, relatively rigid materials (such as metal, plastic, or glass) might form a higher quality grasp with a flexible object (e.g., a textile object) as such rigid materials may support the softer material.

Referring again to FIG. 12, at block 1210, the method may further involve providing a model of one or more fingertips having the particular fingertip geometry, the particular fingertip size and/or the particular fingertip material. In some cases, providing the model may involve sending the model of the one or more fingertips to a particular computing system (e.g., the computing system from which the indication of the given object was received. In other cases, providing the queried model may involve sending the model of the one or more fingertips to a manufacturing assembly (e.g., manufacturing assembly 312 of FIG. 3). The manufacturing assembly may receive the model, perhaps by way of a computing system, and, in some cases, may produce one or more physical instances of the modeled one or more fingertips. As noted above, in some examples, the manufacturing assembly may include a collection of one or more machines or apparatuses configured to produce fingertip based on models of the fingertips. In some cases, the computing system may send, over a network interface, data representing instructions to produce the one or more fingertips on the manufacturing assembly. Such instructions may cause the manufacturing assembly to produce one or more physical instances of the queried model. For instance, the computing system may cause a three-dimensional printer to produce one or more instances of the one or more fingertips, perhaps by way of sending data representing instructions to produce the one or more fingertips according to the model.

The operations described herein may provide a pipeline from a three-dimensional (3-D) model of a given object to a model of one or more fingertips that are specialized to grasp the given object. Further, such operations may produce instructions (i.e., a blueprint) for producing a physical instance of an end-of-arm tool having the one or more fingertips.

It should be understood that arrangements described herein are for purposes of example only. As such, those skilled in the art will appreciate that other arrangements and other elements (e.g. machines, interfaces, functions, orders, and groupings of functions, etc.) can be used instead, and some elements may be omitted altogether according to the desired results. Further, many of the elements that are described are functional entities that may be implemented as discrete or distributed components or in conjunction with other components, in any suitable combination and location, or other structural elements described as independent structures may be combined.

While various aspects and implementations have been disclosed herein, other aspects and implementations will be apparent to those skilled in the art. The various aspects and implementations disclosed herein are for purposes of illustration and are not intended to be limiting, with the true scope being indicated by the following claims, along with the full scope of equivalents to which such claims are entitled. It is also to be understood that the terminology used herein is for the purpose of describing particular implementations only, and is not intended to be limiting.

What is claimed is:

1. A method comprising:
   receiving, by a computing system, a three-dimensional geometric model of a given object;
   determining, by the computing system, a grasp region on the given object;
   iterating, by the computing system, over a plurality of fingertip shapes to determine a particular fingertip shape that matches a shape of the given object at a grasp point within the grasp region;
   after determining the particular fingertip shape, iterating over a plurality of fingertip sizes;
   for each respective fingertip size of the plurality of fingertip sizes, simulating a grasp of the given object at the grasp point by a fingertip having the particular fingertip shape and the respective fingertip size;
   based on the simulating, selecting a particular fingertip size from the plurality of fingertip sizes; and
   subsequently causing, by the computing system, a manufacturing system to produce a physical instance of one or more fingertips having the particular fingertip shape and the particular fingertip size.

2. The method of claim 1, further comprising:
   iterating the one or more fingertips having the particular fingertip shape and the particular fingertip size over a plurality of materials having respective coefficients of friction to determine one or more fingertip materials that exceed a threshold coefficient of friction with the material of the given object at the grasp point; and
   selecting a particular fingertip material from among the determined one or more fingertip materials, wherein the physical instance of the one or more fingertips has the particular fingertip material.

3. The method of claim 1, wherein receiving the three-dimensional geometric model of the given object comprises:
   receiving, over a network interface, an indication of the given object from a second computing system;
   determining that a geometric-model database includes the three-dimensional geometric model for the given object; and
   retrieving, from the geometric-model database, the three-dimensional geometric model for the given object.

4. The method of claim 1, wherein receiving the three-dimensional geometric model of the given object comprises:
   receiving, over a network interface, an indication of the given object from a particular computing system;
   determining that a geometric-model database excludes the three-dimensional geometric model for the given object;
   based on determining that the geometric-model excludes the three-dimensional geometric model for the given object, requesting the three-dimensional geometric model for the given object from the particular computing system; and
   receiving the requested three-dimensional geometric model for the given object from the particular computing system.

5. The method of claim 1, wherein the three-dimensional geometric model of the given object comprises a polygonal mesh defining a shape of the given object.

6. The method of claim 1, wherein the grasp region comprises a region extending around a perimeter of the given object.

7. A computing system comprising:
   one or more processors;
   data storage configured to store instructions, that when executed by the one or more processors, cause the computing system to:
   receive a three-dimensional geometric model of a given object;
   determine a grasp region on the given object;
   iterate over a plurality of fingertip shapes to determine a particular fingertip shape that matches a shape of the given object at a grasp point within the grasp region;
   after determining the particular fingertip shape, iterate over a plurality of fingertip sizes;
   for each respective fingertip size of the plurality of fingertip sizes, simulate a grasp of the given object at the grasp point by a fingertip having the particular fingertip shape and the respective fingertip size;
   based on the simulating, select a particular fingertip size from the plurality of fingertip sizes; and
   subsequently cause a manufacturing system to produce a physical instance of one or more fingertips having the particular fingertip shape and the particular fingertip size.

8. The computing system of claim 7, wherein the grasp region comprises a region extending around a perimeter of the given object.

9. The computing system of claim 7, wherein the plurality of fingertip shapes comprise one or more profiles of contact patches that protrude from respective fingers of an end-of-arm-tool so as to contact the given object during a grasp.

10. The computing system of claim 7, wherein the instructions further cause the computing system to:
    based on a grasp direction, determine a grasp region on the given object having two or more grasp points that are graspable by fingertips.

11. A non-transitory computer readable medium having stored therein instructions executable by one or more processors to cause a computing system to perform functions comprising:
    receiving a three-dimensional geometric model of a given object;
    determining a grasp region on the given object;
    iterating over a plurality of fingertip shapes to determine a particular fingertip shape that matches a shape of the given object at a grasp point within the grasp region;

after determining the particular fingertip shape, iterating over a plurality of fingertip sizes;
for each respective fingertip size of the plurality of fingertip sizes, simulating a grasp of the given object at the grasp point by a fingertip having the particular fingertip shape and the respective fingertip size;
based on the simulating, selecting a particular fingertip size from the plurality of fingertip sizes; and
subsequently causing a manufacturing system to produce a physical instance of one or more fingertips having the particular fingertip shape and the particular fingertip size.

* * * * *